United States Patent
Gurjar et al.

(10) Patent No.: US 11,710,630 B2
(45) Date of Patent: Jul. 25, 2023

(54) PLASMA BLOCK WITH INTEGRATED COOLING

(71) Applicant: Applied Materials, Inc., Santa Clara, CA (US)

(72) Inventors: Tanmay P. Gurjar, Santa Clara, CA (US); Sumit S. Patankar, Santa Clara, CA (US); Sudhir R. Gondhalekar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 475 days.

(21) Appl. No.: 16/856,282

(22) Filed: Apr. 23, 2020

(65) Prior Publication Data

US 2021/0335603 A1 Oct. 28, 2021

(51) Int. Cl.
| | |
|---|---|
| *H01L 21/02* | (2006.01) |
| *H01J 37/305* | (2006.01) |
| *C23F 1/08* | (2006.01) |
| *C23C 14/56* | (2006.01) |
| *H01J 37/32* | (2006.01) |

(52) U.S. Cl.
CPC ........ *H01L 21/02252* (2013.01); *C23C 14/56* (2013.01); *C23F 1/08* (2013.01); *H01J 37/3053* (2013.01); *H01J 37/32357* (2013.01); *H01J 37/32522* (2013.01); *H01J 2237/0437* (2013.01)

(58) Field of Classification Search
CPC ......... H01L 21/02252; H01L 21/67069; H01L 21/67103; H01L 21/67155; H01L 21/67161; H01L 21/67167; H01L 21/67213; C23C 14/56; C23C 16/452; C23C 16/50; C23F 1/08; H01J 37/3053; H01J 37/32357; H01J 37/32522; H01J 2237/0437
See application file for complete search history.

(56) References Cited

U.S. PATENT DOCUMENTS

| | | | | |
|---|---|---|---|---|
| 2004/0237897 | A1* | 12/2004 | Hanawa | ............... H01J 37/321 |
| 2011/0115378 | A1* | 5/2011 | Lubomirsky | ..... H01J 37/32357 315/111.21 |

* cited by examiner

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary semiconductor processing systems may include a remote plasma source. The remote plasma source may include a first plasma block segment defining an inlet to an internal channel of the first plasma block segment. The first plasma block segment may also define a cooling channel between the internal channel of the first plasma block segment and a first exterior surface of the first plasma block segment. The remote plasma source may include a second plasma block segment defining an outlet from an internal channel of the second plasma block segment. The second plasma block segment may also define a cooling channel between the internal channel of the second plasma block segment and a first exterior surface of the second plasma block segment. The systems may include a semiconductor processing chamber defining an inlet fluidly coupled with the outlet from the remote plasma source.

20 Claims, 5 Drawing Sheets

PLASMA BLOCK WITH INTEGRATED COOLING

TECHNICAL FIELD

The present technology relates to components and apparatuses for semiconductor manufacturing. More specifically, the present technology relates to processing chamber plasma components and other semiconductor processing equipment.

BACKGROUND

Integrated circuits are made possible by processes which produce intricately patterned material layers on substrate surfaces. Producing patterned material on a substrate requires controlled methods for forming and removing material. Plasma enhanced deposition and removal operations may utilize in situ plasma formation or remote plasma formation. Remote plasma sources may pose manufacturing challenges to produce plasma paths characterized by beneficial geometries. Consequently, many remote plasma sources are characterized by lower power density in a compromise to improve path geometry through the source.

Thus, there is a need for improved systems and methods that can be used to produce high quality devices and structures. These and other needs are addressed by the present technology.

SUMMARY

Exemplary semiconductor processing systems may include a remote plasma source. The remote plasma source may include a first plasma block segment defining an inlet to an internal channel of the first plasma block segment. The first plasma block segment may also define a cooling channel between the internal channel of the first plasma block segment and a first exterior surface of the first plasma block segment. The remote plasma source may include a second plasma block segment defining an outlet from an internal channel of the second plasma block segment. The second plasma block segment may also define a cooling channel between the internal channel of the second plasma block segment and a first exterior surface of the second plasma block segment. The systems may include a semiconductor processing chamber defining an inlet fluidly coupled with the outlet from the remote plasma source.

In some embodiments, the systems may include a ferrite block defining a first aperture through which the first plasma block segment extends and defining a second aperture through which the second plasma block segment extends. The first plasma block segment and the second plasma block segment together may at least partially define an aperture through the remote plasma source. The systems may include an inductive coil, and the inductive coil may extend about the ferrite block within the aperture through the remote plasma source. The systems may include one or more spacers separating the first plasma block segment from the second plasma block segment. The first plasma block segment may define a first aperture on an exterior surface of the first plasma block segment. The first aperture may be configured to provide fluid access for a cooling fluid to be delivered to the cooling channel. The first plasma block segment may define a second aperture on an exterior surface of the first plasma block segment. The second aperture may be configured to provide fluid access for a cooling fluid to be retrieved from the cooling channel.

The cooling channel of the first plasma block segment and the cooling channel of the second plasma block segment may each be first cooling channels. The first plasma block segment may further define a second cooling channel positioned between the internal channel and a second exterior surface of the first plasma block segment opposite the first exterior surface of the first plasma block segment. The second plasma block segment may further define a second cooling channel positioned between the internal channel and a second exterior surface of the second plasma block segment opposite the first exterior surface of the second plasma block segment. The internal channel of the first plasma block segment and the internal channel of the second plasma block segment may be fluidly coupled to define a bidirectional delivery tube extending from the inlet defined by the first plasma block segment to the outlet defined by the second plasma block segment. The remote plasma source may be characterized by a power density greater than or about 30 W/cc at 6400 W of power delivered. The cooling channel within the first plasma block segment may include a plurality of cooling channels formed between fins defined by the first plasma block segment.

Some embodiments of the present technology may encompass remote plasma sources. The sources may include a first plasma block segment defining an inlet to an internal channel of the first plasma block segment. The first plasma block segment may further define a cooling channel between the internal channel of the first plasma block segment and a first exterior surface of the first plasma block segment. The sources may include a second plasma block segment defining an outlet from an internal channel of the second plasma block segment. The second plasma block segment may further define a cooling channel between the internal channel of the second plasma block segment and a first exterior surface of the second plasma block segment.

In some embodiments, the sources may include a ferrite block defining a first aperture through which the first plasma block segment extends and defining a second aperture through which the second plasma block segment extends. The sources may include one or more spacers separating the first plasma block segment from the second plasma block segment. The first plasma block segment may define a first aperture on an exterior surface of the first plasma block segment. The first aperture may be configured to provide fluid access for a cooling fluid to be delivered to the cooling channel. The cooling channel of the first plasma block segment may be a first cooling channel. The first plasma block segment may further define a second cooling channel positioned between the internal channel and a second exterior surface of the first plasma block segment opposite the first exterior surface of the first plasma block segment. The internal channel of the first plasma block segment and the internal channel of the second plasma block segment may be fluidly coupled to define a bidirectional delivery tube extending from the inlet defined by the first plasma block segment to the outlet defined by the second plasma block segment. The bidirectional delivery tube may be characterized by a linear length about the bidirectional delivery tube of less than or about 40 cm.

Some embodiments of the present technology may encompass semiconductor processing systems. The systems may include a remote plasma source including a first plasma block segment defining an inlet to an internal channel of the first plasma block segment. The first plasma block segment may further define a cooling channel between the internal channel of the first plasma block segment and a first exterior surface of the first plasma block segment. The remote plasma source may include a second plasma block segment defining an outlet from an internal channel of the second plasma block segment. The second plasma block segment may further define a cooling channel between the internal channel of the second plasma block segment and a first exterior surface of the second plasma block segment. The systems may include a ferrite block defining a first aperture through which the first plasma block segment extends and defining a second aperture through which the second plasma block segment extends. In some embodiments, the first plasma block segment and the second plasma block segment together may at least partially define an aperture through the remote plasma source. The semiconductor processing chamber may also include an inductive coil, where the inductive coil may extend about the ferrite block within the aperture through the remote plasma source.

Such technology may provide numerous benefits over conventional systems and techniques. For example, embodiments of the present technology may allow higher power density over conventional remote plasma sources. Additionally, the sources may be characterized by improved heat transfer due to reduced thermal interfaces. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
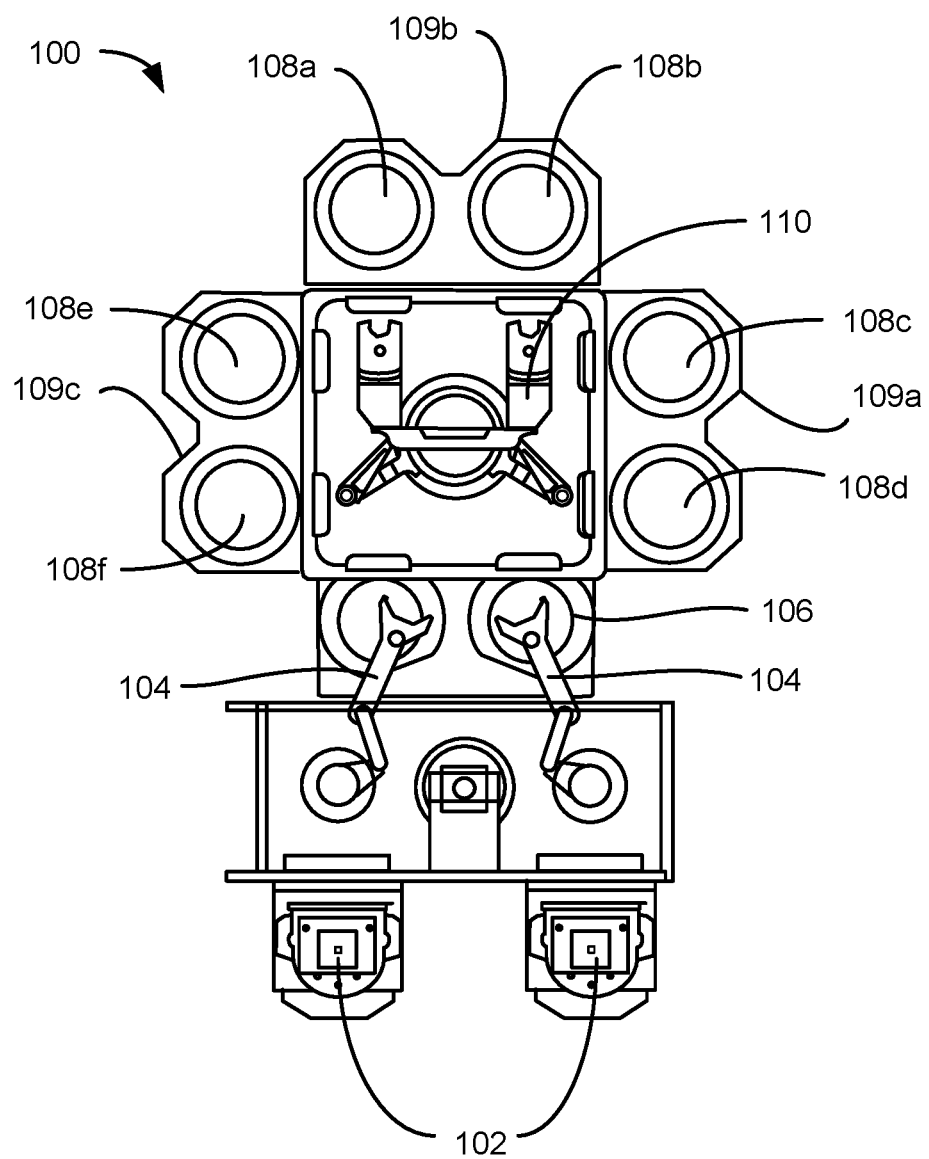
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced operations may utilize an in situ plasma generation or a remote plasma generation. Remote plasma generation may be performed in a number of ways, and in some systems a remote plasma source is utilized. A remote plasma source may include a plasma block, which may be metal, and a ferrite extending about at least a portion of the plasma block. A coil may be wrapped about the ferrite and coupled with a power source to produce an inductively-coupled electromagnetic field within a gas tube of the plasma block. Gas flowed through the tube may be ionized by the energy delivered, which may produce radical components for use in the plasma processing.

Conventional remote plasma sources may include plasma blocks that have been machined to produce the interior flow path. To produce the path, the block may be separated into multiple pieces to facilitate formation of the curvature of the path. The path may be produced to be smooth about the curves to limit erosion of the plasma block during operation. However, to produce an adequate path with subtractive manufacturing, the length of the block may be extended to afford access for tools. This increased length about the tube may reduce the power density of the remote plasma source as the power may be supplied over a greater volume than needed. Additionally, operation of a remote plasma source may produce large amounts of heat, which may be dissipated through block cooling. Many conventional plasma blocks will include heat exchangers coupled with the block to facilitate heat transfer from the block. However, due to tolerance gaps and inefficiencies with coupling, the heat exchangers may not operate as efficiently, which may allow the temperature of the plasma block to increase. Many remote plasma sources are operated to produce complete ionization of a precursor being delivered. As the temperature increases due to inefficient cooling, less than complete ionization may occur, reducing the efficiency of the plasma process being performed, and potentially wasting precursors in the process.

The present technology overcomes many of these issues by producing plasma blocks with additive manufacturing, which may afford incorporated cooling and path formation during the additive process. By producing integrated cooling paths during formation of the plasma block, thermal interfaces from separate heat exchangers may be reduced or removed. Additionally, the additive process may allow more complex flow paths to be incorporated, which may allow a reduction in the number of segments in the plasma block and associated components. Consequently, reduced linear lengths of the gas delivery tube may be produced, which may allow an increase in power density for remote plasma sources according to some embodiments of the present technology.

Although the remaining disclosure will routinely identify specific deposition and cleaning processes utilizing the disclosed technology, it will be readily understood that the systems and methods are equally applicable to other deposition, etching, and cleaning chambers, as well as processes as may occur in the described chambers utilizing remote plasma sources. Accordingly, the technology should not be considered to be so limited as for use with these specific cleaning processes or chambers alone. The disclosure will discuss one possible system and chamber that may include remote plasma sources according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
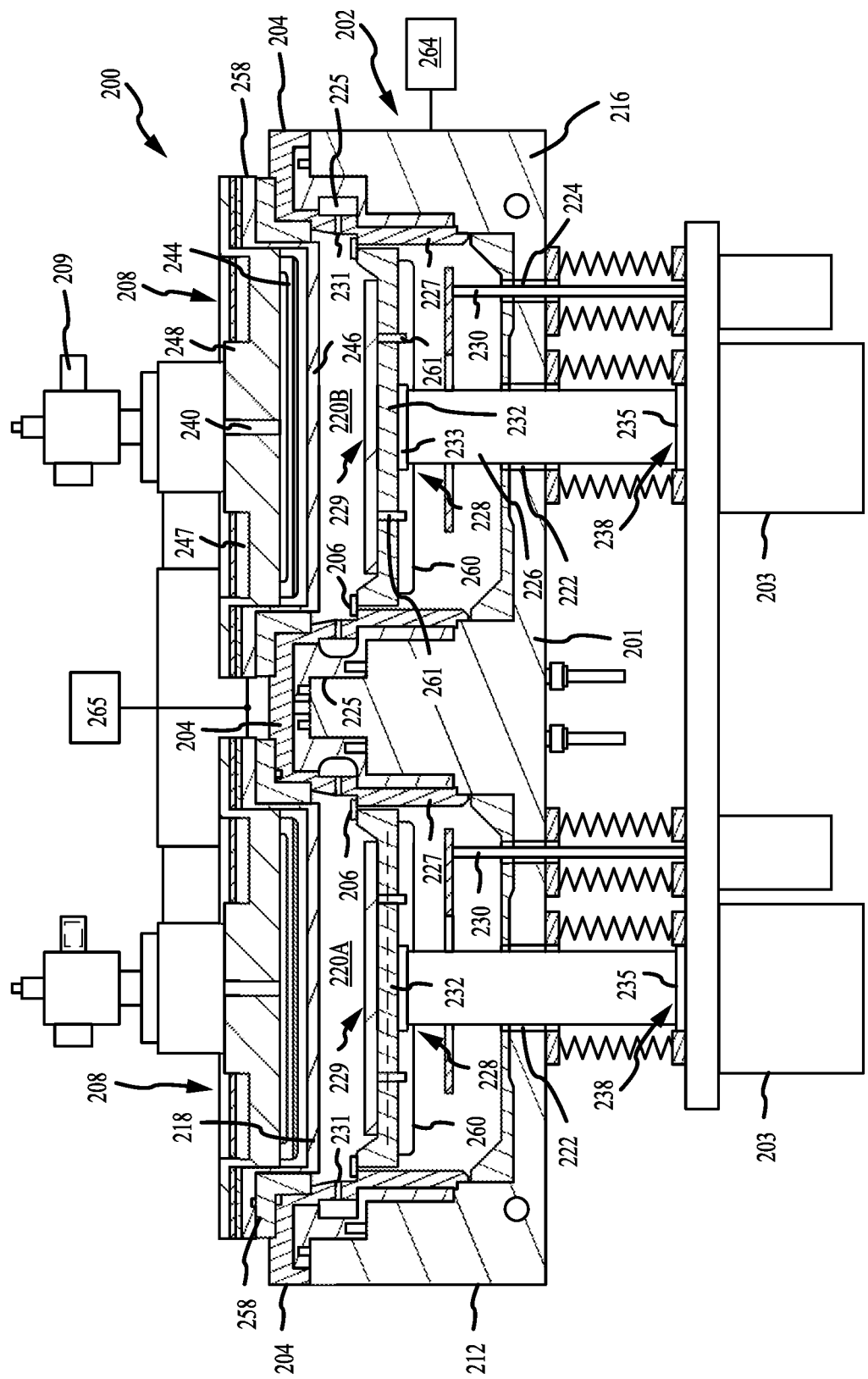
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include remote plasma sources according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. For example, the precursor distribution system may include a remote plasma source 209. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
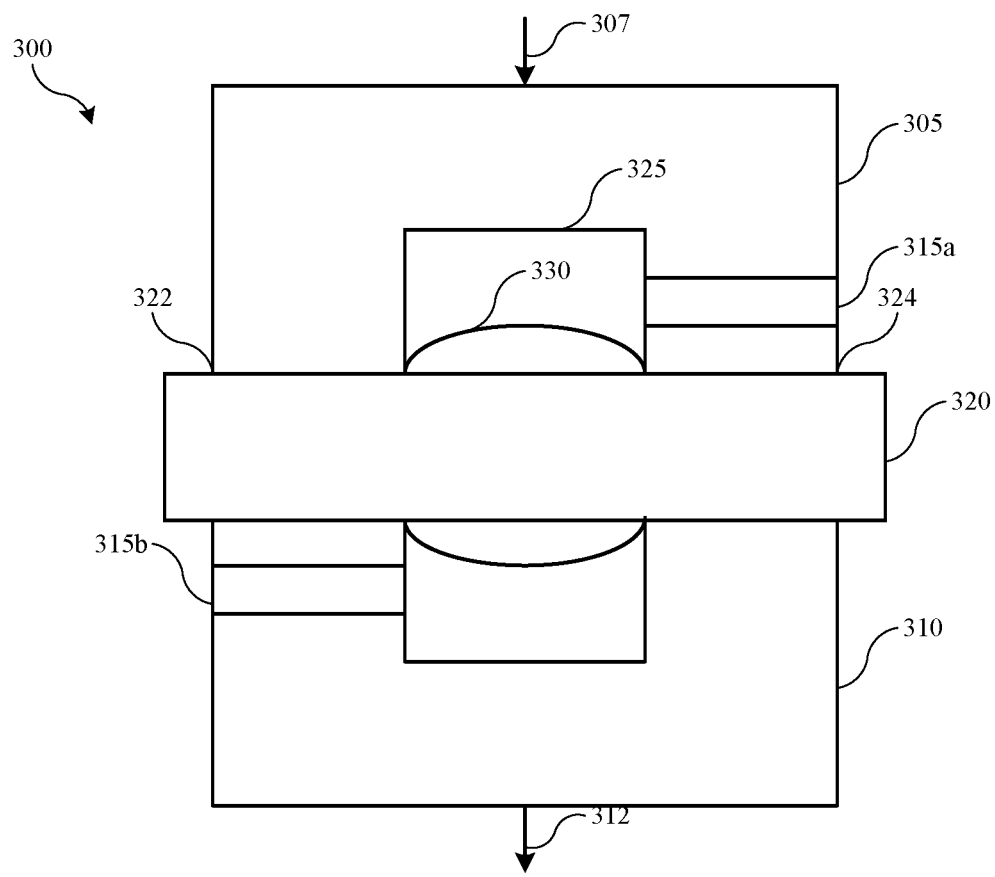
FIG. 3 shows a schematic partial cross-sectional view of an exemplary remote plasma source according to some embodiments of the present technology.

FIG. 3 shows a schematic partial cross-sectional view of an exemplary remote plasma source 300 according to some embodiments of the present technology. FIG. 3 may include one or more components discussed above with regard to FIG. 2, and may illustrate further details relating to that chamber, such as for remote plasma source 209. Source 300 is understood to be configured for integration with any number of processing chambers or systems that may benefit from remote plasma sources. The source 300 may be used to perform chamber cleaning operations subsequent deposition as noted above, as well as other deposition, removal, and cleaning operations that may benefit from remote plasma generation. Source 300 may show a partial view of a remote plasma source, and may include one embodiment of components or features that may be included with remote plasma sources according to embodiments of the present technology, and which are understood to be similarly encompassed by embodiments of source 300 and the present technology.

As noted, FIG. 3 may illustrate a cross section of a remote plasma source 300, such as with an exterior housing removed to illustrate components incorporated with the remote plasma source. The source may include a first plasma block segment 305, and a second plasma block segment 310. First plasma block segment 305 may define an inlet 307, which may provide fluid access to an internal channel as will be described below. Similarly, second plasma block segment 310 may define an outlet 312, which may provide fluid access from an external channel as will be described below. The outlet 312 may be fluidly coupled with an inlet for a semiconductor processing chamber, such as previously described. In some embodiments, one or more spacers may be included to separate the first plasma block segment 305 from the second plasma block segment 310. For example, in some embodiments one of the plasma block segments may be operated at plasma potential, while the other plasma block segment is operated at electrical ground. Accordingly, spacers may prevent shorting between the components. As illustrated, a first spacer 315a may be positioned between one coupling location between the first plasma block segment and the second plasma block segment, and a second spacer 315b may be positioned between a second coupling location between the first plasma block segment and the second plasma block segment.

A ferrite block 320 may extend across the plasma block segments, and may define apertures that the plasma block segments pass through. For example, ferrite block 320 may define a first aperture 322 through which the first plasma block segment 305 may extend, and the ferrite block may define a second aperture 324 through which the second plasma block segment 310 may extend. Although illustrated as a single block, in some embodiments multiple ferrite blocks may be utilized, such as with a first ferrite block extending about the first plasma block segment 305, and a second ferrite block extending about the second plasma block segment 310. When coupled together as illustrated, first plasma block segment 305 and second plasma block segment 310 may define, or at least partially define, an aperture 325 through the remote plasma source 300. In some embodiments, a portion of ferrite block 320 may extend through the aperture. A wire 330, such as an inductive coil, may be wrapped about the ferrite a number of turns within the aperture 325 through the remote plasma source. The wire may be connected to a power source, which may provide electrical power to the wire, and which may be converted to electromagnetic power by the inductive coupling, and which may be used to generate plasma from one or more precursors delivered through the plasma block. Other configurations are similarly encompassed, such as including the wire wrapped separately about the exterior portions of the ferrite, for example, as well as any other coupling or configuration as would be readily appreciated by the skilled artisan as similarly encompassed.

Figure 4:
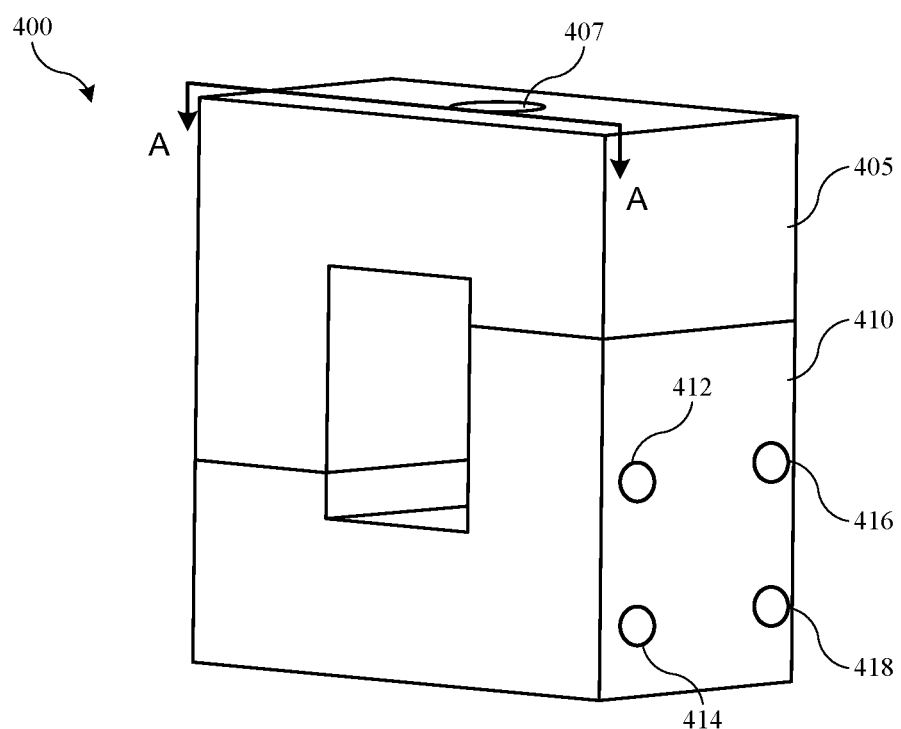
FIG. 4 shows a schematic partial isometric view of an exemplary plasma block according to some embodiments of the present technology.

Turning to FIG. 4 is shown a schematic partial isometric view of an exemplary plasma block 400 according to some embodiments of the present technology. Plasma block 400 may illustrate additional aspects of first plasma block segment 305 and second plasma block segment 310. Although the remaining figures will illustrate just the plasma block segments, it is to be understood that the additional components noted previously may be included, such as spacers between the block segments, one or more ferrite cores extending about the legs of the plasma block, and one or more wires for inductive power coupling. FIG. 4 may illustrate a front face of the plasma block segments, and it is to be understood that a rear face opposite the front face may be identical in some embodiments.

As noted previously, in some embodiments, the plasma block 400 may be formed by additive manufacturing, including by 3D printing of aluminum, or other metals or conductive materials. By utilizing additive manufacturing, each segment of plasma block 400 may be a monolithic component, and the two plasma block segments may be identical as illustrated. While conventional technologies may attach heat exchangers for cooling the plasma block during operation, the present technology may provide integrated cooling channels within the plasma block segments themselves, which may remove thermal interfaces between the heat exchangers and the plasma block. As shown in the figure, plasma block 400 may include any number of components, including one, two, three, four, or more segments, although in some embodiments the plasma block 400 may be two components to limit coupling locations.

Each plasma block segment may include integrated cooling channels as will be described further below. In some embodiments, one or more fluid cooling connection locations may be incorporated within the plasma block segments. For example, as illustrated, plasma block 400 may include a first plasma block segment 405 and a second plasma block segment 410. Inlet 407, which may be similar to inlet 307 described above, may be visible in first plasma block segment 405. From the view illustrated in the figure, fluid inlet and outlet apertures may be visible on an exterior surface of the second plasma block segment 410. A first fluid inlet 412 and a first fluid outlet 414 may be formed on an exterior surface of the plasma block segment, and may provide fluid access to one or more cooling channels of the plasma block segment. Similarly, a second fluid inlet 416 and a second fluid outlet 418 may be formed on the same or a different exterior surface of the plasma block segment, and may provide fluid access to one or more additional cooling channels of the plasma block segment, as will be described further below.

It is to be understood that the first plasma block segment may include similar apertures in the same or different exterior surface of the plasma block segment. In some embodiments, apertures for the fluid inlets or fluid outlets may be on the same or different exterior surfaces of the plasma block segment. For example, any exterior surface of the plasma block segments may include one or more fluid inlet or fluid outlet apertures for delivering or retrieving a temperature controlled fluid for heat transfer from the remote plasma source.

Figure 5:
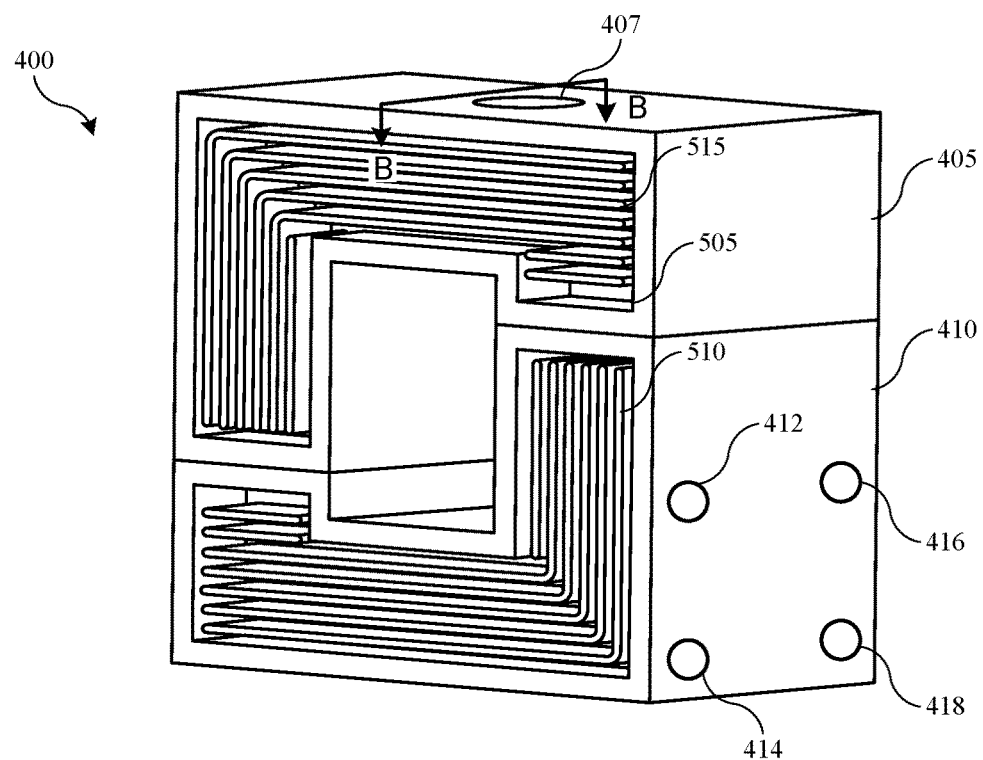
FIG. 5 shows a schematic partial isometric view of an exemplary plasma block according to some embodiments of the present technology.

FIG. 5 shows a schematic partial isometric view of an exemplary plasma block 400 according to some embodiments of the present technology. The figure may illustrate a view of a cross-section through line A-A as shown in FIG.

4. For example, the figure may illustrate a view of plasma block 400 with a front face or exterior surface removed from the plasma block segments, which may allow a view of exemplary integrated cooling channels formed within the plasma block segments. It is to be understood that the front face or exterior surface may be identical on an opposite side of each plasma block segment, and thus a rear face or exterior surface opposite the front face may similarly be included in the plasma block segments, and will be removed in later illustrations for views of the fins. As shown, plasma blocks according to embodiments of the present technology may include one or more cooling channels formed internally between the internal channel of the plasma block segment and an exterior face of the plasma block segment. Because additive manufacturing may produce layers of a component, the cooling channels may be produced within the monolithic body of the plasma block segment.

As illustrated, first plasma block segment 405 may define a first cooling channel 505, including a plurality of cooling channels, formed within the plasma block segment. Additionally, second plasma block segment 410 may define a first cooling channel 510, including a plurality of cooling channels, formed within the plasma block segment. The cooling channels may extend partially through the depth of the cooling block, and may be separated from a gas delivery tube as well as an outer surface of the plasma block segments. A number of fins 515 may be formed or defined within the plasma block segments, which may separate the cooling channel into a plurality of cooling channels or flow paths, and which may improve heat transfer from plasma block segments by increasing the surface area of the plasma block in contact with the fluid being flowed through the cooling channels. As shown, the fins 515 may extend in a pattern including an arcuate portion extending between horizontal and vertical portions of the fin. This may create continuous cooling paths or channels within the cooling block, which may provide improved fluid flow along the channels in some embodiments.

Figure 6:
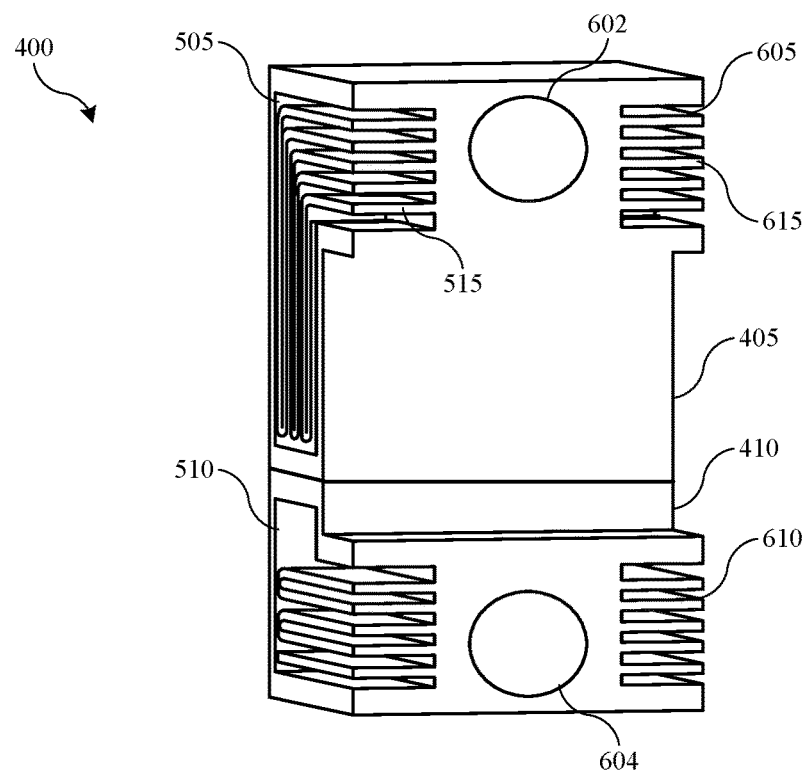
FIG. 6 shows a schematic partial isometric cross-sectional view of an exemplary plasma block according to some embodiments of the present technology.

In some embodiments cooling channels may be formed on each side of the internal channel of the plasma block, which may further improve cooling efficiency of the remote plasma source. FIG. 6 shows a schematic partial isometric cross-sectional view of an exemplary plasma block 400 according to some embodiments of the present technology. The figure may illustrate a cross-section along line B-B as illustrated in FIG. 5. For example, plasma block 400 may include a first plasma block segment 405 and a second plasma block segment 410. The plasma blocks may define an internal channel, which may be used to deliver a processing gas to be ionized within the plasma block. For example, first plasma block segment 405 may define an internal channel 602, and second plasma block segment 410 may define an internal channel 604. On either side of the internal channel, cooling channel fins may extend within the block creating increased surface area for heat transfer to a cooling fluid delivered through the cooling channels.

As noted above, first plasma block segment 405 may define a first cooling channel 505, and second plasma block segment 410 may define a first cooling channel 510. Fins 515 formed within the channel may increase turbulence within the cooling channels, and may create additional surface for heat transfer from the plasma block segment. Additionally, each plasma block segment may define a second cooling channel on an opposite side of the plasma block segment. As illustrated, an exterior surface opposite the front surface is shown removed for emphasis of the fins within the cooling channels, however it is to be understood that the fins and channels may extend from a position partially through the depth of the plasma block segment to the surface of the plasma block segment to provide fluid isolation within the plasma block segment.

As shown in the figure, first plasma block segment 405 may additionally include a second cooling channel 605, which may be formed between the internal channel 602 and an exterior surface or rear surface, which may be opposite the front surface as previously explained, and which is removed from the view similarly to the removal of the front face of the plasma block segments described previously. Second plasma block segment 410 may also include a second cooling channel 610, which may be formed between the internal channel 604 and an exterior surface of the plasma block segment. By including fins and cooling channels within the monolithic plasma block segments, and in some embodiments including them on opposing sides of the internal channel, improved heat transfer may be afforded, which may afford improved temperature control during operation in some embodiments.

Figure 7:
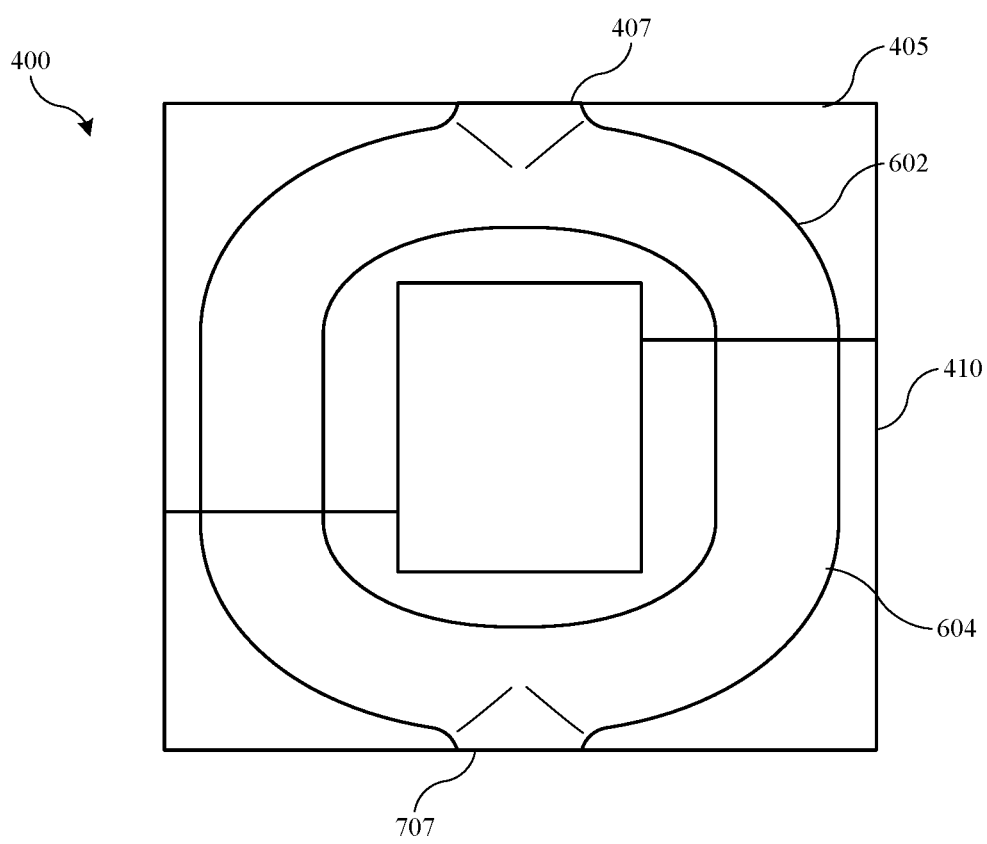
FIG. 7 shows a schematic partial cross-sectional view of an exemplary remote plasma block according to some embodiments of the present technology.

FIG. 7 shows a schematic partial cross-sectional view of an exemplary remote plasma block 400 according to some embodiments of the present technology. The figure may illustrate a cross-sectional view through the precursor delivery tube formed within the block segments as previously described. Again, it is to be understood that spacers may be included between the two plasma block segments as described previously. As illustrated, first plasma block segment 405 may at least partially define an internal channel 602, and second plasma block segment 410 may at least partially define an internal channel 604. When the two components are fluidly coupled with one another, the two internal channels may together define a bidirectional delivery tube extending through the plasma block. A gas inlet 407 may receive process gases to be ionized, and may deliver the process gases to the bidirectional delivery tube. After the gases have been ionized, the bidirectional delivery tube may flow the plasma effluents to outlet 707, which may then deliver the plasma effluents to a semiconductor processing chamber for use in one or more processes.

As discussed previously, conventional manufacturing may have challenges producing the turn radius for the delivery tube at each corner, and thus the plasma blocks may be divided into multiple blocks allowing the corners to be produced at each side. This may require longer components, which may increase the length of the tube within the plasma block. The increase in length is often produced in order to afford sufficiently smooth surfaces. For example, in one non-limiting example, the remote plasma source may be used to provide fluorine plasma effluents, such as may be produced from nitrogen trifluoride, for example. Once the plasma effluents are produced in the plasma block, the fluorine radicals may flow towards the outlet 707, and may flow across the two turns in the delivery tube extending towards the outlet. As the plasma block may be, for example, aluminum, to limit fluorine interaction with the aluminum, an interior surface of the delivery tube may be anodized or oxidized. Were sharp corners formed within the delivery tube, these corners may erode over time from the reactive halogen effluents. Because the anodization thickness may be on the order or microns, the coating may be readily removed in such situations. Once aluminum is exposed, the fluorine may begin removing the aluminum through reaction, which may cause damage and eventual failure to the plasma block. Accordingly, accepting longer delivery tube dimensions may occur to ensure an adequately smooth turn or transition. These conventional designs also included upwards of eight to fifteen separate components to produce the plasma block, which greatly increased the number of component interfaces.

The present technology may not require increased lengths, as the delivery tube may be defined with additive manufacturing as well, and any radius may be produced based on the length needed, and without added length based on requirements for tool access. Additionally, the entire plasma block may be one or two components, limiting the number of interfaces of the plasma block. Consequently, for delivery tubes characterized by a particular outer diameter and turn radius, which may be similar to conventionally manufactured designs, the linear length may be reduced in some embodiments of the present technology. For example, for plasma blocks defining delivery tubes characterized by a tube diameter of about 2.5 cm, and a turn radius of about 1.25 cm, the tube may be characterized by a linear length about the delivery tube of less than or about 40 cm, and may be less than or about 38 cm, less than or about 37 cm, less than or about 36 cm, less than or about 35 cm, less than or about 34 cm, or less, which may extend fully about the loop formed in the plasma block. The spacers described above may be less than or about 5 cm in thickness, and may be less than or about 4 cm, less than or about 3 cm, less than or about 2 cm, less than or about 1 cm, less than or about 0.5 cm, or less, producing limited additional distance to the delivery tube length.

By producing delivery tubes with reduced linear distances around the tube, the volume of the tube may similarly be reduced. For example, with delivery tubes of the dimensions described above, the present technology may produce delivery tubes characterized by a volume within the delivery tube of less than or about 200 $cm^3$, and which may be less than or about 195 $cm^3$, less than or about 190 $cm^3$, less than or about 188 $cm^3$, less than or about 186 $cm^3$, less than or about 184 $cm^3$, less than or about 182 $cm^3$, less than or about 180 $cm^3$, less than or about 178 $cm^3$, less than or about 176 $cm^3$, less than or about 174 $cm^3$, less than or about 172 $cm^3$, less than or about 170 $cm^3$, or less. Consequently, improved power densities may be afforded compared to conventional designs. For example, plasma blocks according to the present technology, such as including delivery tube dimensions as described, at a given power deliver of 6,400 W, may provide a power density of greater than or about 30 $W/cm^3$, and may provide a power density of greater than or about 31 $W/cm^3$, greater than or about 32 $W/cm^3$, greater than or about 33 $W/cm^3$, greater than or about 34 $W/cm^3$, greater than or about 35 $W/cm^3$, greater than or about 36 $W/cm^3$, greater than or about 37 $W/cm^3$, greater than or about 38 $W/cm^3$, or higher. By producing higher power densities, some embodiments may require less power to produce similar power densities of conventional remote plasma sources, which may afford lower power requirements. This may in turn reduce heat generated by the operation of the block. Remote plasma sources according to some embodiments of the present technology may be characterized by increased power density over conventional designs. By further including integrated cooling as described above, remote plasma sources according to embodiments of the present technology may provide greater operational efficiency than conventional configurations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a block" includes a plurality of such blocks, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing system comprising:
   a remote plasma source comprising:
      a monolithic first plasma block segment defining an inlet to an internal channel of the first plasma block segment, wherein the first plasma block segment further defines a cooling channel between the internal channel of the first plasma block segment and a first exterior surface of the first plasma block segment, and
      a monolithic second plasma block segment defining an outlet from an internal channel of the second plasma block segment, wherein the second plasma block segment further defines a cooling channel between the internal channel of the second plasma block segment and a first exterior surface of the second plasma block segment; and
   a semiconductor processing chamber defining an inlet fluidly coupled with the outlet from the remote plasma source.

2. The semiconductor processing system of claim 1, further comprising:
   a ferrite block defining a first aperture through which the first plasma block segment extends and defining a second aperture through which the second plasma block segment extends.

3. The semiconductor processing system of claim 2, wherein the first plasma block segment and the second plasma block segment together at least partially define an aperture through the remote plasma source.

4. The semiconductor processing system of claim 3, further comprising:
an inductive coil, wherein the inductive coil extends about the ferrite block within the aperture through the remote plasma source.

5. The semiconductor processing system of claim 1, further comprising:
one or more spacers separating the first plasma block segment from the second plasma block segment.

6. The semiconductor processing system of claim 1, wherein the first plasma block segment defines a first aperture on an exterior surface of the first plasma block segment, the first aperture configured to provide fluid access for a cooling fluid to be delivered to the cooling channel.

7. The semiconductor processing system of claim 6, wherein the first plasma block segment defines a second aperture on an exterior surface of the first plasma block segment, the second aperture configured to provide fluid access for a cooling fluid to be retrieved from the cooling channel.

8. The semiconductor processing system of claim 1, wherein the cooling channel of the first plasma block segment and the cooling channel of the second plasma block segment are each first cooling channels, wherein the first plasma block segment further defines a second cooling channel positioned between the internal channel and a second exterior surface of the first plasma block segment opposite the first exterior surface of the first plasma block segment, and wherein the second plasma block segment further defines a second cooling channel positioned between the internal channel and a second exterior surface of the second plasma block segment opposite the first exterior surface of the second plasma block segment.

9. The semiconductor processing system of claim 1, wherein the internal channel of the first plasma block segment and the internal channel of the second plasma block segment are fluidly coupled to define a bidirectional delivery tube extending from the inlet defined by the first plasma block segment to the outlet defined by the second plasma block segment.

10. The semiconductor processing system of claim 1, wherein the remote plasma source is characterized by a power density greater than or about 30 W/cc at 6400 W of power delivered.

11. The semiconductor processing system of claim 1, wherein the cooling channel within the first plasma block segment comprises a plurality of cooling channels formed between fins defined by the first plasma block segment.

12. A remote plasma source comprising:
a monolithic first plasma block segment defining an inlet to an internal channel of the first plasma block segment, wherein the first plasma block segment further defines a cooling channel between the internal channel of the first plasma block segment and a first exterior surface of the first plasma block segment; and
a monolithic second plasma block segment defining an outlet from an internal channel of the second plasma block segment, wherein the second plasma block segment further defines a cooling channel between the internal channel of the second plasma block segment and a first exterior surface of the second plasma block segment.

13. The remote plasma source of claim 12, further comprising:
a ferrite block defining a first aperture through which the first plasma block segment extends and defining a second aperture through which the second plasma block segment extends.

14. The remote plasma source of claim 12, further comprising:
one or more spacers separating the first plasma block segment from the second plasma block segment.

15. The remote plasma source of claim 12, wherein the first plasma block segment defines a first aperture on an exterior surface of the first plasma block segment, the first aperture configured to provide fluid access for a cooling fluid to be delivered to the cooling channel.

16. The remote plasma source of claim 12, wherein the cooling channel of the first plasma block segment is a first cooling channel, wherein the first plasma block segment further defines a second cooling channel positioned between the internal channel and a second exterior surface of the first plasma block segment opposite the first exterior surface of the first plasma block segment.

17. The remote plasma source of claim 12, wherein the internal channel of the first plasma block segment and the internal channel of the second plasma block segment are fluidly coupled to define a bidirectional delivery tube extending from the inlet defined by the first plasma block segment to the outlet defined by the second plasma block segment.

18. The remote plasma source of claim 17, wherein the bidirectional delivery tube is characterized by a linear length about the bidirectional delivery tube of less than or about 40 cm.

19. A semiconductor processing system comprising:
a remote plasma source comprising:
a monolithic first plasma block segment defining an inlet to an internal channel of the first plasma block segment, wherein the first plasma block segment further defines a cooling channel between the internal channel of the first plasma block segment and a first exterior surface of the first plasma block segment,
a monolithic second plasma block segment defining an outlet from an internal channel of the second plasma block segment, wherein the second plasma block segment further defines a cooling channel between the internal channel of the second plasma block segment and a first exterior surface of the second plasma block segment, and
a ferrite block defining a first aperture through which the first plasma block segment extends and defining a second aperture through which the second plasma block segment extends.

20. The semiconductor processing system of claim 19, wherein the first plasma block segment and the second plasma block segment together at least partially define an aperture through the remote plasma source, the semiconductor processing chamber further comprising:
an inductive coil, wherein the inductive coil extends about the ferrite block within the aperture through the remote plasma source.

* * * * *